United States Patent
Horsky

(10) Patent No.: US 10,171,073 B2
(45) Date of Patent: Jan. 1, 2019

(54) REGULATING TRANSITION SLOPE USING DIFFERENTIAL OUTPUT

(71) Applicant: SEMICONDUCTOR COMPONENTS INDUSTRIES, LLC, Phoenix, AZ (US)

(72) Inventor: Pavel Horsky, Brno (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 9 days.

(21) Appl. No.: 15/491,287

(22) Filed: Apr. 19, 2017

(65) Prior Publication Data

US 2018/0309439 A1    Oct. 25, 2018

(51) Int. Cl.
| | |
|---|---|
| *H03K 17/10* | (2006.01) |
| *H03K 17/16* | (2006.01) |
| *G11C 27/02* | (2006.01) |
| *H03K 5/19* | (2006.01) |
| *H02P 8/12* | (2006.01) |

(52) U.S. Cl.
CPC ......... *H03K 17/162* (2013.01); *G11C 27/026* (2013.01); *H02P 8/12* (2013.01); *H03K 5/19* (2013.01)

(58) Field of Classification Search
None
See application file for complete search history.

(56) References Cited

U.S. PATENT DOCUMENTS

| | | | |
|---|---|---|---|
| 5,818,260 A | 10/1998 | Kuo | |
| 6,281,730 B1 | 8/2001 | Vu | |
| 7,109,768 B2 | 9/2006 | Rashid | |
| 2003/0094970 A1 | 5/2003 | Freitas | |
| 2008/0211847 A1* | 9/2008 | Shamoun | B41J 2/04541 347/10 |
| 2009/0278516 A1* | 11/2009 | Bhagwat | H02M 3/1588 323/270 |
| 2017/0237250 A1 | 8/2017 | Chang et al. | |

OTHER PUBLICATIONS

Francois Laulanet, "Regulating Transistor Slope," U.S. Appl. No. 15/440,439, filed Feb. 23, 2017, 14 pages.

* cited by examiner

*Primary Examiner* — Cassandra Cox
(74) *Attorney, Agent, or Firm* — Ramey & Schwaller, LLP

(57) ABSTRACT

A circuit includes a first driver, a second driver, and one or more monitor modules coupled to the first or second driver to measure slope times of the first or second driver. The circuit further includes a comparator coupled to the one or more monitor modules to compare the slope times of the first and second drivers. The circuit further includes one or more regulators coupled to the comparator and the first or second driver to regulate a slope of the first or second driver, based on output of the comparator, at most once per pulse cycle until the slope of the first or second driver reaches a target slope.

19 Claims, 6 Drawing Sheets

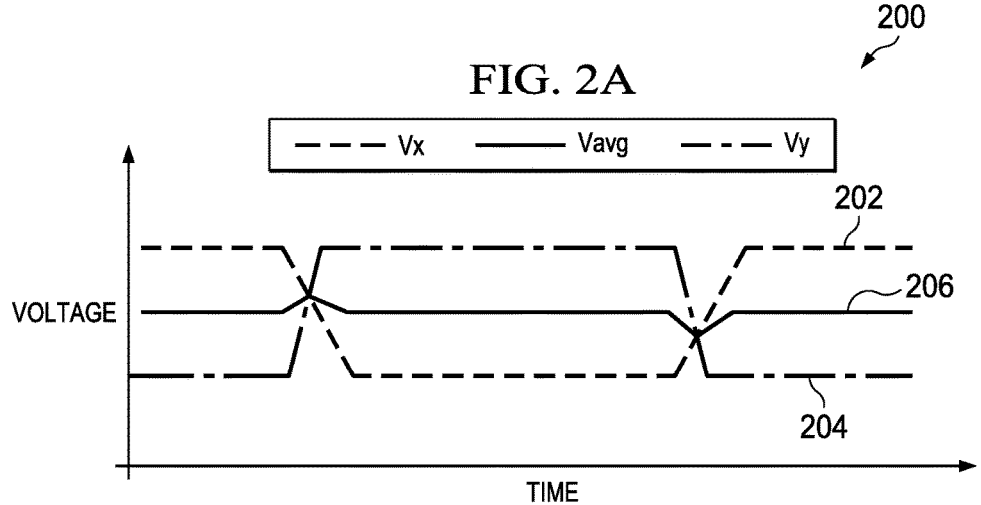
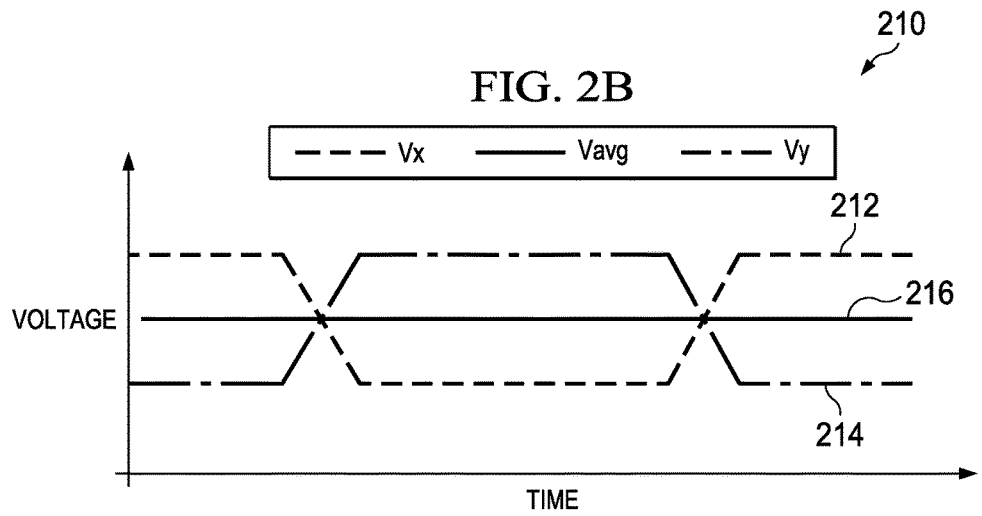

REGULATING TRANSITION SLOPE USING DIFFERENTIAL OUTPUT

BACKGROUND

Metal-oxide-semiconductor field-effect transistors ("MOSFETs") are commonly used, alone or in combination with other transistors, as a power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the "on" state, a voltage is applied to the gate structure to form a conduction channel region between the source and drain regions, which allows current to flow through the device. In the "off" state, any voltage applied to the gate structure is sufficiently low so that a conduction channel does not form, and thus current flow does not occur. In the off state, the device may support a high voltage between the source region and the drain region.

Switching, or transitioning, from an off state to an on state, or from an on state to an off state, is not instantaneous. Rather, some amount of time is necessary for the voltage or current of the device to reach each state from the other, and controlling such time is difficult to achieve without extra circuit elements, known as trimming, which introduce undesirable complexity and cost into the circuit and products containing the device. Additionally, the trimming components must account for transition time dependency on temperature, topology, and even package stress. Finally, when multiple transistors are used to provide or control an output voltage or current, the voltage or current supplied undesirably fluctuates based on differentials between such times for each transistor. Among other undesirable behavior, such fluctuations cause electromagnetic compatibility ("EMC") emissions, which increases costs (due to the need for shielding) and decreases performance.

SUMMARY

A circuit includes a first driver, a second driver, and one or more monitor modules coupled to the first or second driver to measure slope times of the first or second driver. The circuit further includes a comparator coupled to the one or more monitor modules to compare the slope times of the first and second drivers. The circuit further includes one or more regulators coupled to the comparator and the first or second driver to adjust a slope of the first or second driver, based on output of the comparator, at most once per pulse cycle until the slope of the first or second driver reaches a target slope.

The one or more regulators may adjust the slope by initiating an increase or decrease in voltage or current supplied to the first or second driver at most once per pulse cycle until the slope of the first or second driver reaches the target slope. The one or more regulators may adjust the slope by adjusting the start time of voltage or current supplied or denied to the first or second driver at most once per pulse cycle until the slope of the first or second driver reaches the target slope. Measuring the slope times may include determining a time at which a slope of the first driver begins and determining a time at which a slope of the second driver begins, and comparing the slope times of the first and second drivers may include comparing the times at which the slopes of the first and second drivers begin. Measuring the slope times may include determining a time at which a slope of the first driver ends and determining a time at which a slope of the second driver ends, and comparing the slope times of the first and second drivers may include comparing the times at which the slopes of the first and second drivers end. Comparing the slope times of the first and second drivers may include comparing the duration of the slopes of the first and second drivers. The one or more regulators may regulate such that an average of the voltage or current of the first driver with the second driver is constant. The target slope may be the slope of the first or second drivers, whichever is not being regulated, with the opposite sign. Regulating the slope may include regulating the slopes of both the first and second drivers based on output of the comparator. The first driver may include a first pair of transistors including a common node at which slope time is measured, and the second driver may include a second pair of transistors including a different common node at which slope time is measured. The circuit may drive an inductive load via twisted pair cable. The circuit may drive a DC stepper motor. The comparator may also track a second circuit condition different from slope, the second circuit condition selected from the group consisting of an under load, an open load, an over voltage load, an over current, and a short circuit.

A method includes measuring slope times of first and second drivers and comparing the slope times of the first and second drivers. The method further includes adjusting a slope of the first or second driver, based on the comparison, at most once per pulse cycle until the slope of the first or second driver reaches a target slope.

Adjusting the slope may include initiating an increase or decrease in voltage or current supplied to the first or second driver at most once per pulse cycle until the slope of the first or second driver reaches the target slope. Adjusting the slope may include adjusting the start time of voltage or current supplied or denied to the first or second driver at most once per pulse cycle until the slope of the first or second driver reaches a target slope. The target slope may be the slope of the first or second driver, whichever is not being regulated, with the opposite sign. Measuring the slope times may include determining times at which the slopes for the first and second drivers begin and end, and comparing the slope times may include comparing the times at which the slopes of the first and second drivers begin and comparing the times at which the slopes of the first and second drivers end. The method may further include driving an inductive load via twisted pair cable using the first and second drivers. The method may further include driving a DC stepper motor using the first and second drivers.

BRIEF DESCRIPTION OF THE DRAWINGS

Accordingly, systems, circuits, and methods for regulating transistor slope using differential output are disclosed herein. In the drawings:

FIG. 2A is a graph of illustrative variations that may occur due to mismatched driver slopes;

FIG. 2B is a graph of illustrative regulation causing matching driver slopes;

Figure 1:
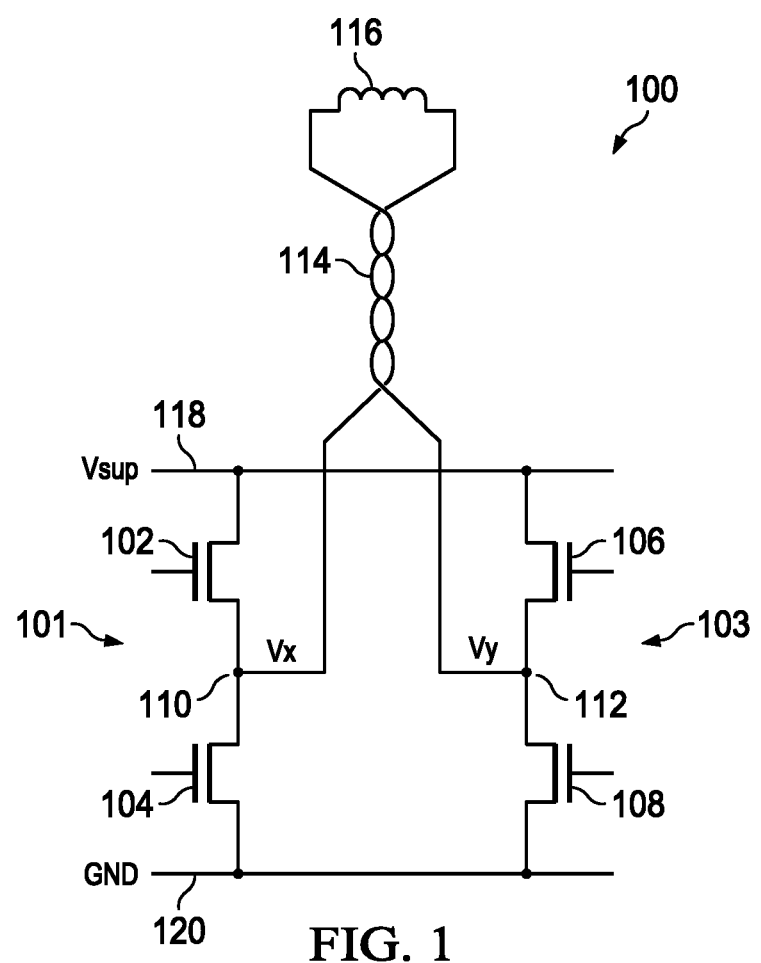
FIG. 1 is a diagram of an illustrative H-bridge configuration of drivers driving a load.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

Slope is measured in output (voltage or current) per unit time during the transitions between on and off states. The time to reach each state must be within certain tolerances informed by the surrounding circuitry and application. A typical general purpose device may have a slope of 5V per microsecond. Low power op-amps may have slopes of 0.5V per microsecond whereas fast op-amps may have slopes of 50V per microsecond or more. However, the variations in slope due to trimming, temperature, topology, package stress, and the like greatly increases the probability that such tolerances will be violated. Additionally, such variations increase EMC emissions, which increase costs and decrease performance. Matching slopes of drivers or single transistors greatly reduce or eliminate such concerns. For clarity, the examples used herein will refer to voltage output, but the same concepts may be used for current output.

FIG. 1 illustrates a circuit 100 including two drivers 101, 103. One driver 101 includes two transistors 102, 104, and the other driver 103 also includes two transistors 106, 108. The transistors 102, 104, 106, 108 are in a H-bridge configuration. Specifically, in each driver 101, 103, the two transistors share a common node 110, 112, while one transistor is coupled to a constant supply 118 (here a voltage supply, but in other embodiments, a current supply), and the other transistor is coupled to ground 120. In other embodiments, the circuit 100 includes a different configuration, number of drivers, number of transistors, and number of transistors per driver.

The drivers 101, 103 drive an inductive load 116 via a twisted cable pair 114 coupled to the common nodes 110, 112. In other embodiments, the drivers 101, 103 drive different types of loads and the twisted cable pair 114 is omitted. For example, the drivers 101, 103 may drive a DC stepper motor or a differential communication bus such as a controller area network ("CAN") bus or low-voltage differential signaling ("LVDS") bus. The slope for one driver 101 is measured at the common node 110, and the slope for the other driver 103 is measured at the common node 112. For clarity, voltage slopes will be used in the examples herein. As such, $V_x$ is the voltage measured at common node 110, and $V_y$ is the voltage measured at common node 112. However, in other embodiments, current slopes are used. Accordingly in another embodiment, $I_x$ is the current flowing from the driver 101 to the load 116, and $I_y$ is the current flowing from the driver 103 to the load 116. The slopes for $V_x$ and $V_y$ are regulated such that they are equal and opposite as illustrated in FIGS. 2A-2B.

FIG. 2A is a graph illustrating how mismatched slopes measured at $V_x$ 202 and $V_y$ 204 cause fluctuations in the common mode voltage supplied to the load. Specifically, common mode voltage $V_{avg}$ 206 is the average of $V_x$ 202 and $V_y$ 204, and $V_{avg}$ 206 should remain constant over time. During the non-transition periods, when both $V_x$ 202 and $V_y$ 204 are either high or low, $V_{avg}$ 206 does remain constant. However, during the transition periods, when $V_x$ 202 or $V_y$ 204 is transitioning from high to low or low to high, mismatches in the slopes of $V_x$ 202 and $V_y$ 204 cause $V_{avg}$ 206 to fluctuate. Specifically, in this example during the first transition period, because the slope of $V_y$ 204 is steeper than the slope of $V_x$ 202 (disregarding the sign), $V_{avg}$ is elevated until $V_x$ 202 reaches the low state, at which point $V_{avg}$ 206 is constant until the second transition period. During the second transition period, because the slope of $V_y$ 204 is steeper than the slope of $V_x$ 202 (disregarding the sign), $V_{avg}$ 206 is pulled down until $V_x$ 202 reaches the high state, at which point $V_{avg}$ 206 is again constant.

These undesirable fluctuations in $V_{avg}$ 206 result in higher electromagnetic emissions which can disturb operation of other electronic systems. For example, in the automotive industry, there are strict requirements to limit EMC emissions of electronic systems for safety purposes. Loads, e.g. stepper motor drivers or solenoids, can be connected by a relatively long twisted pair cable, which serves as an antenna and emits EMC disturbances caused by fluctuation of the common mode voltage. These EMC emissions negatively influence other electronic systems. Other circuit configurations, not only twisted pair cables, cause such fluctuation. Using the slope regulation concepts described herein, such undesirable fluctuations are minimized or eliminated entirely as shown in FIG. 2B.

FIG. 2B is graph illustrating how $V_{avg}$ 216 remains constant over time, especially through transitions, once the slopes of $V_x$ 212 and $V_y$ 214 are matched (equal and opposite). Specifically, the begin times of the slopes of $V_x$ 212 and $V_y$ 214 are aligned, the end times of the slopes of $V_x$ 212 and $V_y$ 214 are aligned, and the steepness of the slopes $V_x$ 212 and $V_y$ 214 match (disregarding the sign). Specifically, the rising slope of $V_x$ matches falling slope of $V_y$, and falling slope on $V_x$ matches rising slope on $V_y$. In general, a rising slope on $V_x$ does not need to match a rising slope on $V_y$. Accordingly, at any two points during the transition periods, the average of $V_x$ 212 and $V_y$ 214 is the same. As such, $V_{avg}$ 216 remains constant during the transition periods and the fluctuations shown in FIG. 2A are eliminated. By eliminating such undesirable fluctuations, the common mode voltage of the twisted pair connection from the drivers to the load is constant, and the electromagnetic emissions are eliminated or greatly reduced. Using comparators is one way to determine the mismatch as illustrated in FIG. 3.

Figure 3:
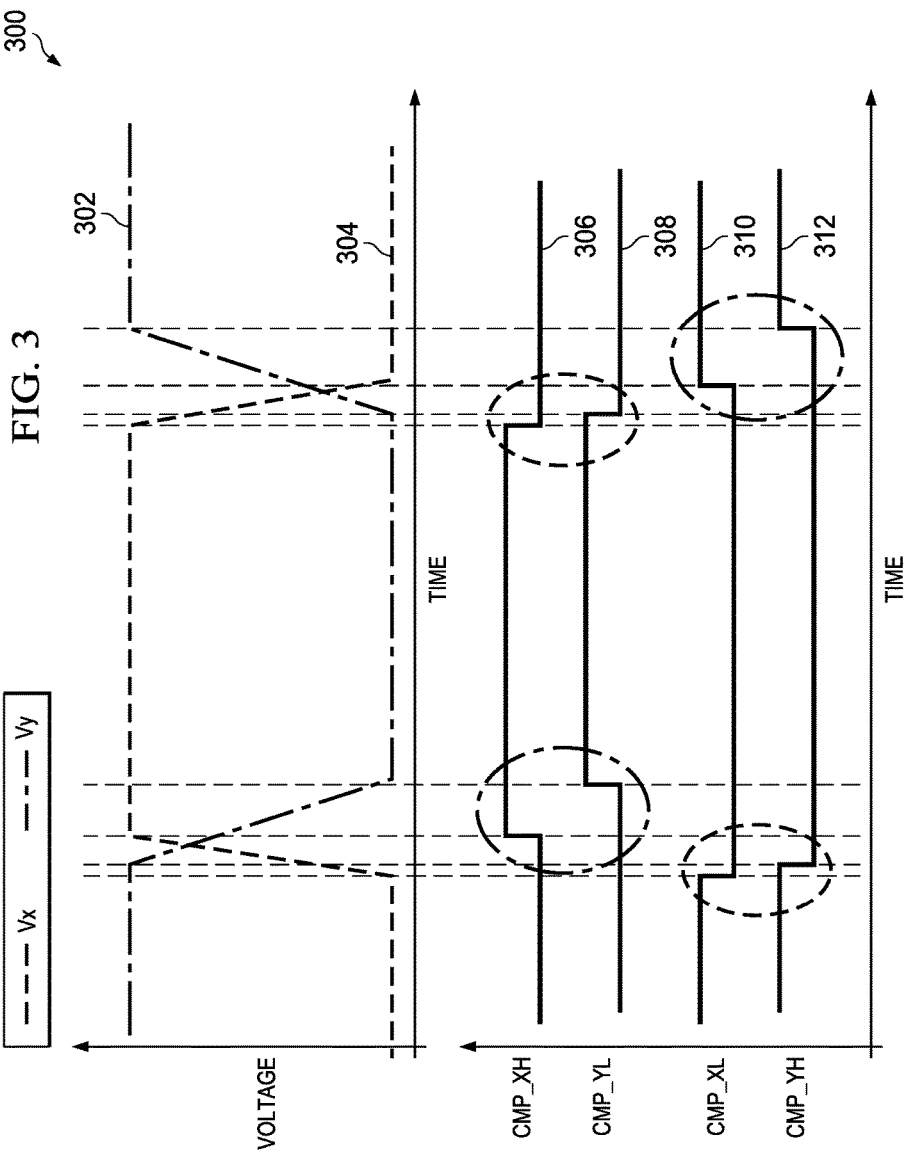
FIG. 3 is a graph of illustrative comparison of mismatching driver slopes.

FIG. 3 is a graph 300 illustrating mismatching driver slopes and how such mismatches may be identified or compared. Over the depicted time period, the voltage $V_y$ 302 transitions from high to low and back to high again. Similarly, the voltage $V_x$ 304 transitions from low to high and back to low again over the same time period. However, the begin times, end times, and slopes of the transitions of $V_x$ 304 and $V_y$ 302 do not match. Such mismatch causes the undesirable fluctuations shown in FIG. 2A. In order to match the slopes, i.e. regulate one or both of $V_x$ 304 and $V_y$ 302 such that they have equal and opposite slopes, one way to determine the mismatch is to compare the begin times and end times of the slopes.

As illustrated, the output of four comparators are used to determine the extent of the mismatch. In other embodiments, a different number of comparators or different circuit elements altogether are used. One comparator, CMP_XH 306, outputs a high signal when $V_x$ 304 is high, i.e. not low and not in transition. Another comparator, CMP_YL 308, outputs a high signal when $V_y$ 302 is low, i.e. not high and not in transition. Another comparator, CMP_XL 310, outputs a high signal when $V_x$ 304 is low, i.e. not high and not in transition. Another comparator, CMP_YH 312, outputs a high signal when $V_y$ 302 is high, i.e. not low and not in transition.

By comparing the output of the comparators 306, 308, 310, and 312, the mismatch may be determined. Specifically, four comparisons may be made as illustrated by the dashed circles. First, the begin times of the first transition may be compared by determining the time difference between CMP_XL 310 going low and CMP_YH 312 going low. Second, the end times of the first transition may be compared by determining the time difference between CMP_XH 306 going high and CMP_YL 308 going high. Third, the begin times of the second transition may be compared by determining the time difference between CMP_XH 306 going low and CMP_YL 308 going low. Fourth, the end times of the second transition may be compared by determining the time difference between CMP_XL 310 going high and CMP_YH 312 going high. One hardware configuration that implements a comparison between rising and falling slopes is shown in FIG. 7.

Figure 4:
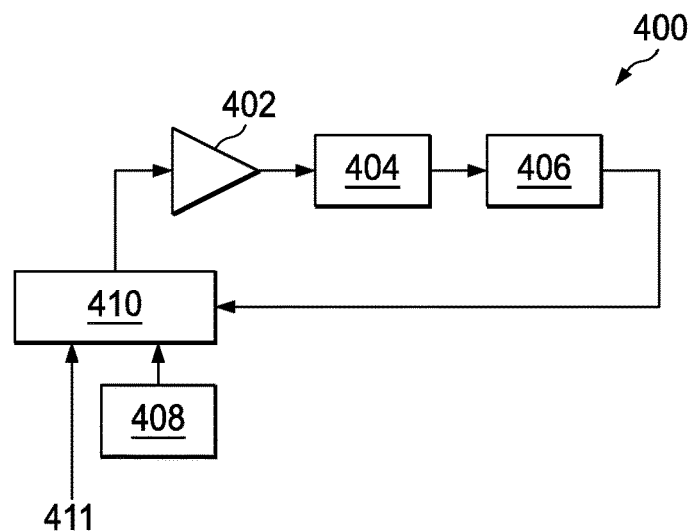
FIG. 4 is circuit diagram illustrating a specific implementation of regulating driver slope.
Figure 7:
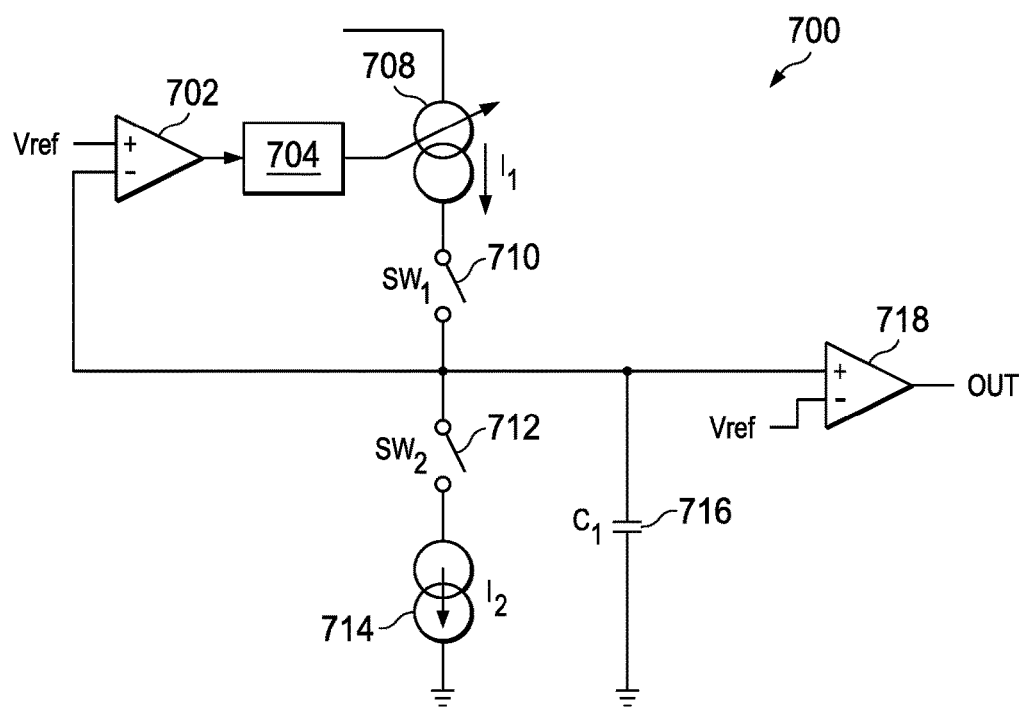
FIG. 7 is a circuit diagram illustrating a specific implementation of regulating driver slope.

FIG. 7 is a circuit diagram illustrating a specific implementation of comparing the slopes of two drivers. The circuit 700 includes operational amplifier 702, comparator 718, a sample and hold element 704, two current sources 708, 714, two switches 710, 712, and a capacitor 716. During the non-transition periods, when both $V_x$ and $V_y$ are either high or low, both switches 710 and 712 will be on, sample and hold circuit 704 will be in tracking mode, and the operational amplifier 702 will regulate reference voltage, $V_{ref}$, on the capacitor 716 and ensure both currents $I_1$ and $I_2$ are the same. Before the transition, the sample and hold circuit 704 will enter hold mode and fix the current of the current source 708. Next, both switches 710, 712 will be disconnected. During a rising slope, the first switch 710 is closed (on), charging the capacitor 716. During a falling slope, the second switch 712 is closed (on), draining the capacitor 716. As such, the charge on the capacitor 716 (or the voltage on the capacitor compared to $V_{ref}$) when both switches 710, 712 are open indicates the difference in time between rising and falling slopes. Based on the time comparison, regulation of one or more of the slopes may be performed in the next cycle. FIG. 4 illustrates how driver regulation occurs in at least one embodiment.

FIG. 4 is a circuit diagram illustrating regulation of driver slope to a target slope. Specifically, in various embodiments, drivers are regulated such that the drivers have matching (equal and opposite) slopes. With respect to FIG. 3, if multiple drivers are to be regulated, e.g. if $V_x$ 304 and $V_y$ 302 are to be adjusted, then the target slope may be a predetermined slope that is optimized for ideal timing considering the surrounding circuitry and application. As such, the circuitry of FIG. 4 may be duplicated for another driver.

With respect to FIG. 4, the circuit 400 includes a driver 404 and a monitor module 406 coupled to the driver 404 to evaluate the voltage or the current across the driver 404. The current or voltage may be evaluated at or across any desired portions of the driver 404, and the driver 404 may be of any type depending upon the surrounding circuitry and application. For example, the driver 404 may be of the types illustrated and described with respect to FIG. 1.

The circuit 400 further includes a comparator 410 coupled to the monitor module 406 to compare the voltage or the current across the driver 404 with one or more reference currents or voltages, one or more voltages or current from other drivers, or the like as illustrated and described with respect to FIG. 3. The output of the monitor module 406 may be coupled to the input of the comparator 410. Here, the comparator 410 receives one or more of signals 306, 308, 310, 312 as input. Using the signals, the comparator 410 evaluates the times or durations of slopes of the driver 404. The same comparator 410 may be used for multiple drivers in various embodiments. In an alternative embodiment, the comparator is implemented as the circuit 700 described with respect to FIG. 7.

The comparator 410 may also be coupled to a clock 408, and the output of the clock 408 may be coupled to the input of the comparator 410. The clock 408 may be implemented as a phase locked loop or oscillator in various embodiments, and the clock signal may be used to align the signals of the monitor module 406 and references for comparison purposes. In other embodiments, the clock 408 is omitted. The comparator 410 and clock 408 need not be specifically added or exclusively repurposed to the circuit 400 for purposes of slope regulation. Rather, in most applications sufficient circuitry already exists to implement to comparator 410 and clock 408 during slope regulation alongside their other functions. In this way, excess circuitry that introduces instability and EMC emissions to the overall system need not be added to take advantage of slope regulation. Rather, previously existing circuitry may be given extra functionality as elements of slope regulation.

In at least one embodiment, the comparator 410 changes its output depending on whether the output of the monitor module 406 is greater or less than the reference voltage or current at a specific time provided by the clock 408. In some embodiments, the comparator 410 may be relatively simple such as a check for a higher or lower magnitude resulting in a step increase or decrease in current or voltage. In other embodiments, the comparator 410 may be relatively complex such as a microcontroller implementing an algorithm resulting in a multi-step increase or decrease in voltage or current. For example, the comparator 410 is a proportional integral derivative controller in at least one embodiment. The complexity of the comparator 410 may be informed by the needs of the surround circuitry and application.

Per the example of FIG. 1, the comparator 410 compares the slope times of the first and second drivers, e.g. the begin times, end times, and durations of $V_x$ and $V_y$. The comparator 410 also tracks a second circuit condition different from slope, such as an under load, an open load, an over voltage load, an over current, and a short circuit for other circuitry (not shown).

The circuit 400 further includes a regulator 402 coupled to the comparator 410 and the driver 404 to regulate, or initiate regulation of, the slope of the driver 404 based on output of the comparator 410 by increasing or decreasing voltage or current supplied to the driver 404 at most once per pulse cycle until the slope reaches the target slope. The regulator also regulates the slope by adjusting the start time of voltage or current supplied or denied to the driver 404 at most once per pulse cycle until the slope of the driver 404 reaches the target slope. Depending upon the type and magnitude of the regulation, one or many cycles may be used until the slope of the driver 404 reaches the target slope. The output of the comparator 410 may be coupled to the input of the regulator 402, while the output of the regulator 402 may be coupled to the input of the driver 404. The input of the driver 404 may be any portion of the driver 404 as desired, and the driver 404 may be of any type. The regulator 402 may include or be coupled to a voltage source or current source in order to facilitate such increase or decrease.

Figure 5:
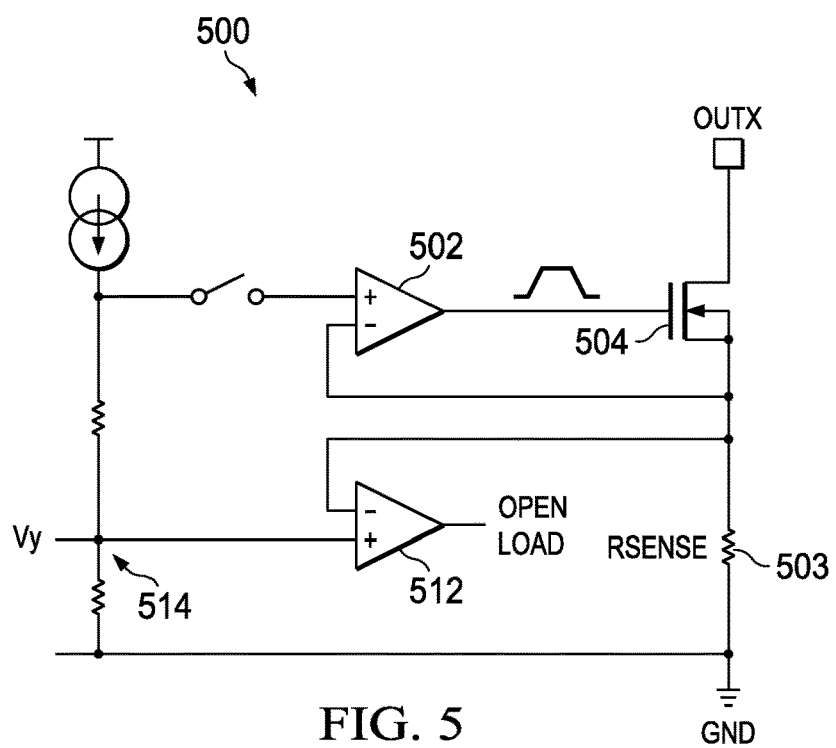
FIG. 5 is a circuit diagram illustrating a specific implementation of regulating driver slope.

FIG. 5 is a circuit diagram illustrating a specific implementation of regulating the slopes of one or more drivers. The circuit 500 includes a driver 504, which may output to a coupled monitor module (not shown) to evaluate the voltage and/or current across the transistor 504.

The circuit 500 further includes a comparator 512 to compare the voltage across the RSENSE resistor 503, with one or more reference voltages 514, such as $V_y$. The comparator 512 changes its output depending on whether the output of the monitor module is greater or less than the reference voltage. In other embodiments, the comparator 512 changes its output based on a multi-step algorithm informed by the surrounding circuitry and application. The comparator 512 may also track a second circuit condition different from the slopes such as an under load, an open load, an over voltage load, an over current, and/or a short circuit. Here, the comparator 512 is tracking an open load condition. In this way, existing circuitry may be given extra functionality for slope regulation.

The circuit 500 further includes a regulator 502 coupled to the comparator 512 and the driver 504 to regulate a slope of the transistor 504 based on output of the comparator 512 by increasing or decreasing, or initiating an increase or decrease in, currents and/or voltages supplied to the driver 504 at most once per pulse cycle until the slope reaches the target slopes. For example, the regulator 502 may increase voltage and/or current supplied to the driver 504 if the slope is less steep than the target slopes, and the regulator 502 may decrease voltage and/or current supplied to the transistor 504 if the slope is steeper than the target slope. The regulator 502 may also adjust the start time of the driver 504 at most one per pulse cycle for alignment purposes.

The output of the comparator 512 may be coupled to the input of the regulator 502, while the output of the regulator 502 may be coupled to the input of the driver 504. The input of the driver 504 may be any portion of the driver 504 as desired, and the driver 504 may be of any type. The circuit 500 may drive a light emitting diode, a motor, or the like.

Figure 6:
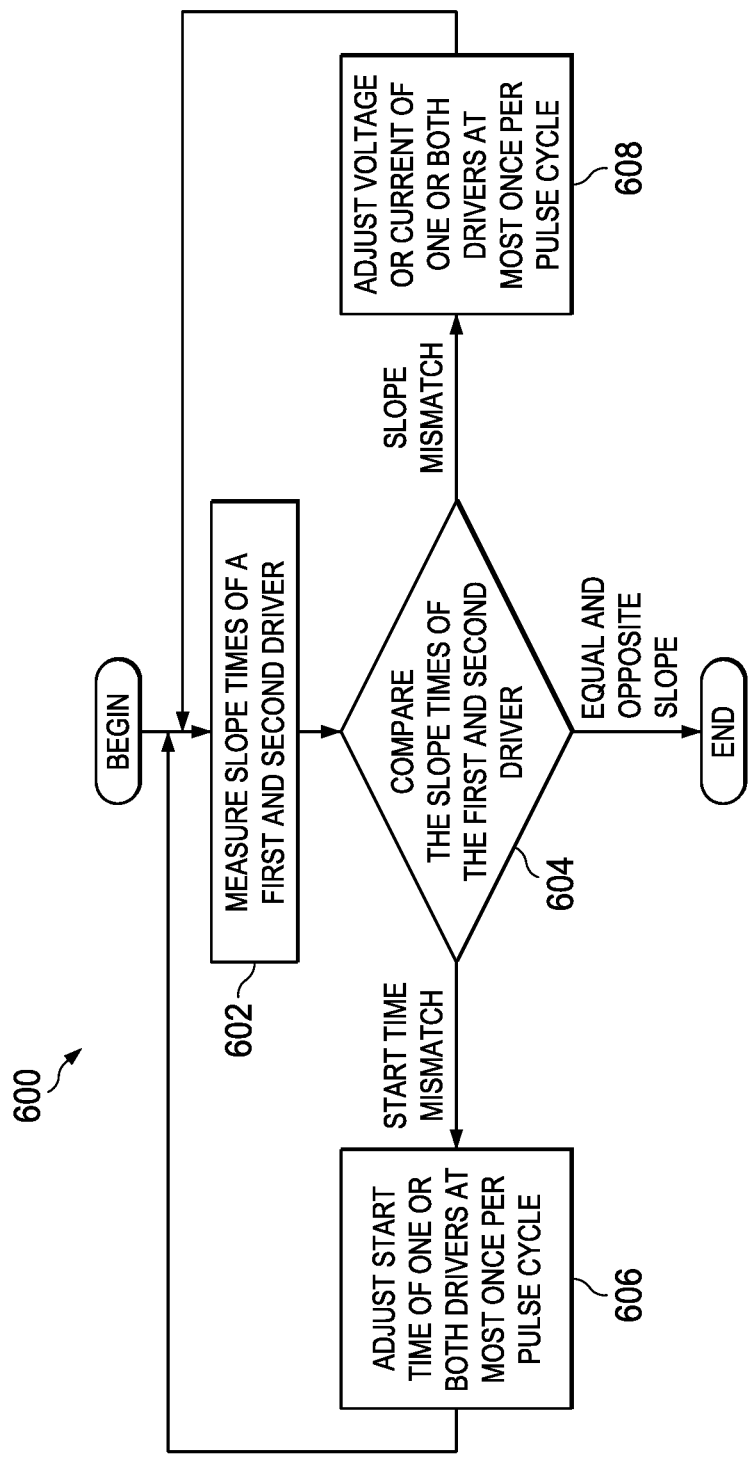
FIG. 6 is a flow diagram of an illustrative method for regulating driver slope.

FIG. 6 is a flow diagram of an illustrative method 600 for regulating driver slope. For clarity, two drivers will be discussed. However, in various embodiments more drivers may be regulated. At 602, the slope times of a first and second driver are measured. The first driver may include a first pair of transistors including a common node at which slope time is measured, and the second driver may include a second pair of transistors including a different common node at which slope time is measured. Measuring the slope times may include determining times at which the slopes for the first and second drivers begin and end and determining the durations of the slopes.

At 604, the slope times of the first and second drivers are compared. Comparing the slope times may include comparing the times at which the slopes of the first and second drivers begin, comparing the times at which the slopes of the first and second drivers end, and comparing the durations of the slopes. Comparing the slope may also include simultaneously tracking a second circuit condition different from the slope using the comparator. The second circuit condition may be an under load, an open load, an over voltage load, an over current, and/or a short circuit.

The target slope may be the slope of the first driver, second driver, or a predetermined target slope if both drivers are to be regulated. For clarity, regulation of one driver will be discussed. If the driver slope is the same steepness as the target slope, then the method ends. If the driver slope is steeper than the target slope, then voltage or current supplied to the driver is decreased at 608 at most once per pulse cycle, or period, until the driver slope reaches the target slope. If the driver slope is less steep than the target slope, then voltage or current supplied to the driver is increased at 608 at most once per pulse cycle, or period, until the driver slope reaches the target slope. The increase or decrease may be performed in fixed steps or proportional to the difference measured in various embodiments, resulting in a different number of cycles being used to perform the regulation in various embodiments.

If the driver slope has a different start time than the target slope, at 606 the start time of voltage or current supplied or denied to the driver is adjusted at most once per pulse cycle until the driver slope reaches the target slope. In various embodiments, regulation of the start time mismatch and slope mismatch can run sequentially or concurrently. The method 600 may be used to drive an inductive load via twisted pair cable a DC stepper motor, a LED, a motor, differential communication line, and the like.

By using the concepts described herein, regulating transistor slope may be achieved without extra circuit elements, which introduce undesirable complexity and cost into the circuitry and products containing the device. Additionally, EMC emissions are greatly reduced or eliminated entirely. Finally, current slopes that previously may have been mismatched by as much as 40% may be mismatched by only 2% using the concepts herein; indeed mismatches may also be eliminated entirely. Such reduction in mismatch may improve signal quality by reducing undesirable EMC emission by as much as 26 dB.

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A circuit for producing a differential output signal pair, the circuit comprising:
   a first driver for a first output signal in the differential output signal pair;
   a second driver for a second output signal in the differential output signal pair;

one or more monitor modules coupled to the first and second drivers to measure slope times of the first and second drivers during each transition;

a comparator coupled to the one or more monitor modules to compare the slope times of the first and second drivers;

one or more regulators coupled to the comparator and at least one of the first and second drivers to regulate at least one slope time of the first or second driver, based on output of the comparator, to provide the first and second output signals in the differential output signal pair with a constant average.

2. The circuit of claim 1, wherein the one or more regulators regulate the at least one slope time by initiating an increase or decrease in voltage or current supplied to the at least one of the first and second drivers at most once per pulse cycle until the constant average is achieved.

3. The circuit of claim 1, wherein the one or more regulators regulate the at least one slope time by adjusting a start time of a voltage or current transition supplied to the at least one of the first and second drivers at most once per pulse cycle until the first and second drivers have matching start times.

4. The circuit of claim 1, wherein the slope times are measured at least in part by determining a start time at which a transition of the first driver begins and determining a start time at which a transition of the second driver begins, and wherein the slope times of the first and second drivers are compared at least in part by comparing the start times for the first and second drivers.

5. The circuit of claim 1, wherein the slope times are measured at least in part by determining an end time at which a transition of the first driver ends and determining an end time at which a transition of the second driver ends, and wherein the slope times of the first and second drivers are compared at least in part by comparing the end times for the first and second drivers.

6. The circuit of claim 1, wherein the slope times of the first and second drivers are compared at least in part by comparing durations of transitions of the first and second drivers.

7. The circuit of claim 1, wherein the at least one slope time of the first and second drivers is regulated by causing transitions of the first and second drivers to have complementary slopes.

8. The circuit of claim 1, wherein slope times of both the first and second drivers are regulated based on output of the comparator.

9. The circuit of claim 1, wherein the first driver comprises a first pair of transistors having a common node at which said at least one slope time is measured, and wherein the second driver comprises a second pair of transistors having a different common node at which a second slope time is measured.

10. The circuit of claim 1, wherein the differential output signal pair drives an inductive load via twisted pair cable.

11. The circuit of claim 1, wherein the differential output signal pair drives a DC stepper motor.

12. The circuit of claim 1, wherein the comparator also tracks a second circuit condition different from slope, the second circuit condition selected from the group consisting of: an under load, an open load, an over voltage load, an over current, and a short circuit.

13. A method for producing a differential output signal pair, the method comprising:
    measuring slope times of first and second drivers;
    comparing the slope times of the first and second drivers;
    regulating at least one slope time of the first or second driver, based on the comparison, to provide the first and second output signals in the differential output signal pair with a constant average.

14. The method of claim 13, wherein said regulating the at least one slope time comprises initiating an increase or decrease in voltage or current supplied to at least one of the first or second drivers at most once per pulse cycle until the constant average is achieved.

15. The method of claim 13, wherein said regulating the at least one slope time comprises adjusting a start time of a voltage or current transition supplied to the at least one of the first or second driver at most once per pulse cycle until the first and second drivers have matching start times.

16. The method of claim 13, wherein the at least one slope time is regulated by causing transitions of the first and second drivers to have complementary slopes.

17. The method of claim 13, wherein said measuring the slope times comprises determining start times and end times for transitions of the first and second drivers, and wherein said comparing the slope times comprises:
    comparing the start times for the first and second drivers; and
    comparing the end times for the first and second drivers.

18. The method of claim 13, further comprising driving an inductive load via twisted pair cable with the differential output signal pair.

19. The method of claim 13, further comprising driving a DC stepper motor with the differential output signal pair.

* * * * *